United States Patent [19]

Kastenholz et al.

[11] Patent Number: 5,809,218
[45] Date of Patent: Sep. 15, 1998

[54] METHOD FOR THE ELECTRONIC ASSEMBLY OF PRINTER'S FORMS

[75] Inventors: Peter Kastenholz, Butzbach; Arno Gahler, Schmitten, both of Germany

[73] Assignee: Linotyoe-Hell AG, Kiel, Germany

[21] Appl. No.: 605,152

[22] PCT Filed: Sep. 7, 1994

[86] PCT No.: PCT/DE94/01024

§ 371 Date: Apr. 15, 1996

§ 102(e) Date: Apr. 15, 1996

[87] PCT Pub. No.: WO95/07507

PCT Pub. Date: Mar. 16, 1995

[30] Foreign Application Priority Data

Sep. 7, 1993 [DE] Germany .......................... 43 30 242.4

[51] Int. Cl.⁶ ...................................................... G06K 15/00
[52] U.S. Cl. ............................................. 395/115; 395/117
[58] Field of Search .......................... 395/112, 114–115, 395/117, 502, 505, 511, 823, 824, 829, 842, 853, 892, 894; 399/1, 382; 707/522, 527

[56] References Cited

U.S. PATENT DOCUMENTS

| | | |
|---|---|---|
| 4,493,108 | 1/1985 | Fryer et al. . |
| 4,970,554 | 11/1990 | Rourke ......................... 399/1 |
| 5,179,637 | 1/1993 | Nardozzi ................................. 395/114 |

FOREIGN PATENT DOCUMENTS

| | | |
|---|---|---|
| 0 419 811 A2 | 4/1991 | European Pat. Off. . |
| 0 430 261 A3 | 6/1991 | European Pat. Off. . |
| 0 495 563 A2 | 7/1992 | European Pat. Off. . |
| 0 310 765 | 7/1988 | Germany . |
| 41 21 564 A1 | 1/1992 | Germany . |

OTHER PUBLICATIONS

10156 C'T Magazin Fur Computertechnik (1991) Jun., No. 6 Hannover, DE Im Rahmen des Unublichen.

Drucken wie die Profis 2087 Elektronic 40 (1991) 28 Mai, No. 11, Muenchen, DE.

*Primary Examiner*—Arthur G. Evans
*Attorney, Agent, or Firm*—Hill & Simpson

[57] ABSTRACT

In a method for electronic assembly of a printing form with an assembly station, the imposition of pages into a printing form is undertaken with the assembly station, whereby a form PostScript file is generated that contains all data for output of the printing form. Individual PostScript pages are successively stored as a PostScript job in one or more print-to-disk files on the server. The print-to-disk files are loaded into the assembly station via the network. A first form print-to-disk file is generated at the assembly station. This first form print-to-disk file contains include instructions which indicate how the individual pages should be arranged on the printing form and where the individual pages are located within the print-to-disk files, instead of containing the contents of the individual pages of the print-to-disk file or files. The first form PostScript file is transmitted to the server and a second form PostScript file is generated in the server by use of the include instructions. Specifically, using the include instructions, the contents of the pages of the form are called from the print-to-disk files located on the server and are inserted into the first form PostScript file transmitted onto the server from the assembly station at that location at which they are to be located on the printing form. This thus created second form PostScript file is transmitted from the server to the output station for the output of the printing form.

2 Claims, 2 Drawing Sheets

1

METHOD FOR THE ELECTRONIC ASSEMBLY OF PRINTER'S FORMS

BACKGROUND OF THE INVENTION

The assembly of the individual pages to form print forms can be implemented manually or with an assembly station. An assembly station is a "WYSIWIG" picture screen work station (WYSIWIG=what you see is what you get), at which a plurality of pages that are present as what are referred to as PostScript pages are combined into a form under visual control. Structure and general functioning of such a form assembly station are described in the brochure "Signastation" of Linotype-Hell AG, Germany, pages 1 through 8, order number 1292T MDO Lino 001/4d, 188–198 FHM. The assembled form is printed as a PostScript document and contains all information that are required for what is referred to as a print-conforming output. PostScript is a page description language that was developed and introduced into the marketplace by Adobe Systems, Mountainview, Calif., U.S.A., and that has become a world standard. This page description language is described, for example, in the manual "PostScript Language Reference Manual", Second Edition, Addison-Wesley Publishing Company, Inc., ISBN 0-201-18127-4. What is involved here is a program language executed on what are referred to as RIPs (RIP=raster image processor) to which a film exposer, also referred to as recorder or image setter, is connected for outputting the pages onto film. In these programs, also referred to as DTP programs (DTP=desktop publishing), what is referred to as a PostScript job in which a plurality of pages reside in a file following one another is generated. These jobs are also called print-to-disk files and can comprise a plurality of megabytes.

The assembly station is very often operated in combination with a server within an image and text processing system. The server has a number of functions; among other things, it serves both as a filing system for the PostScript documents to be processed (file server) as a well as reception and output system for forms to be exposed (print server). The connection between the assembly station and the server and the remaining components of the image and text processing system occurs via a network, for example Ethernet. In this communication between the assembly station and the RIP via the server, the individual pages to be imposed are asynchronously compiled on the server into whole PostScript printer's forms during the interactive imposition process. The data are thereby repeatedly transmitted over the network. This requires enormous network resources since data volumes of more than 100 megabytes must be transmitted. This also negatively influences the time behavior of the system in a lasting way, and the assembly station is blocked for other jobs during this time.

SUMMARY OF THE INVENTION

In a forms assembly station in combination with a server and/or RIP, an object of the invention is to increase the speed by reducing the network load and to improve the overall performance behavior of the system. Further, the previous time-consuming, cost-intensive and partly error-affected assembly should be implemented in a fast and dependable electronic process.

BRIEF DESCRIPTION OF THE DRAWINGS

The invention is explained in greater detail below with reference to FIGS. 1 through 3.

DESCRIPTION OF THE PREFERRED EMBODIMENTS

Figure 1:
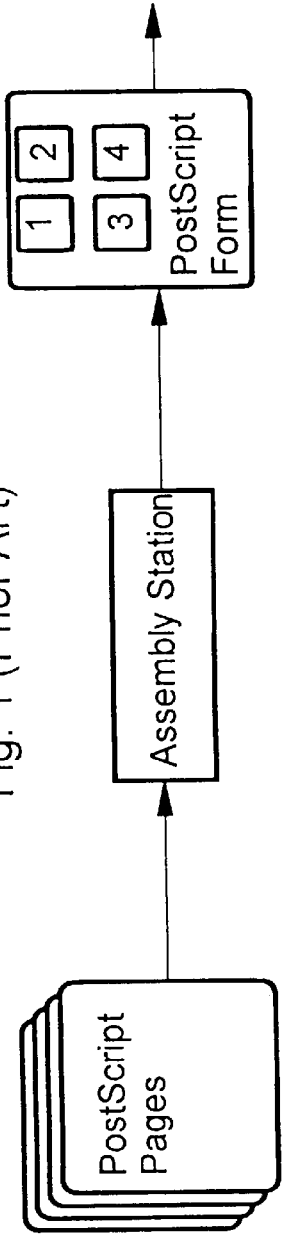
FIG. 1 shows the page assembly method of the prior art.

FIG. 1 describes the execution sequence according to the prior art. As already initially set forth, the data of the complete PostScript pages, i.e. the print-to-disk jobs, reside on the server as files. The data flow in the assembly of a printer's form, i.e. the generating of a form PostScript job, is as follows. These pages, i.e. the PostScript document or, respectively, the print-to-disk job, is loaded into the assembly station in arrow direction from the server via the network as a corresponding file. The assembly station internally notes what pages exist and at what positions they lie within the print-to-disk file. The assembly station does not note the content of the pages since these are a matter of files that can comprise several hundred megabytes. In order to generate a form PostScript job in the assembly station, the assembly station must thus call the original print-to-disk job, i.e. the corresponding file, into the assembly station from the server a second time in order to clip the part having the pages to be currently built in therefrom and enter them in its own form PostScript job. After the assembly, this form PostScript job is in turn sent back to the print server function area of the server (printer queue) as a file. The memory shown at the left side in FIG. 1, in which the PostScript pages are stored, and the memory at the right, in which the PostScript form that contains the pages 1,2,3 and 4 is stored, are memory areas of the server. Overall, the page contents are thus transmitted over the network three times, since the connection between assembly station and server occurs over the network.

Figure 2:
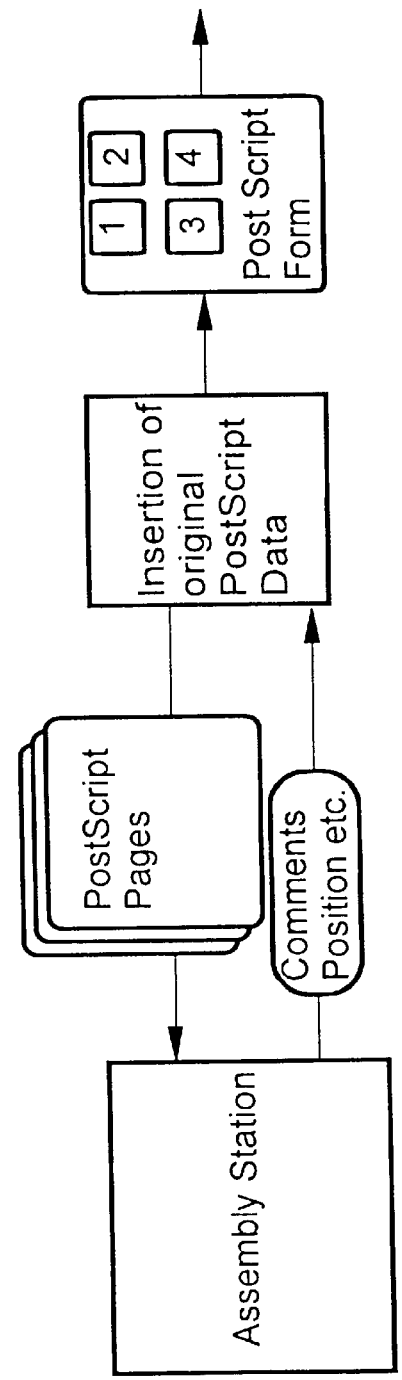
FIG. 2 is a schematic execution of the inventive page assembly method of the invention.

The method of the invention is fundamentally explained below and then described in greater detail with reference to FIGS. 2 and 3.

The PostScript pages are transmitted from the memory of the server into the assembly station. According to the invention, the content of the individual pages is no longer introduced into the form PostScript job, i.e. into the form PostScript file, in the assembly station; rather, only a respective reference is provided to where the individual page content can be found in the print-to-disk file. The new form PostScript file (rump file) generated in this way is then transmitted over the network to the server. This is identified in FIG. 2 with "Comments, Positions, etc.", that are transmitted from the assembly station into the server. This file is significantly smaller than the file ultimately generated on the server for the exposure. It thus has only a fraction of the data of such a form PostScript data generated according to the prior art available to it. The write access of the network to this "rump file" can therefore be neglected in view of a write access to a corresponding form PostScript file that would have been generated according to the prior art.

These references contained in this file are also called include instructions. After the transmission of the file onto the server, the include instructions are executed in a process sequencing separately on the server without burdening the network. In the block circuit diagram of FIG. 2, this occurs within the block "Insertion of the Original PostScript Data". What the instructions effect is that the correct page contents, i.e. the correct parts of the print-to-disk files (PostScript files) that describe the individual pages, are inserted at the corresponding location of the form PostScript file that had been generated by the assembly station. The corresponding page is thereby positioned, i.e. assembled at the desired location within the printer's form. This process occurs in that part of the server that was initially referred to as print server. The page contents are simply called and copied into the form PostScript file that had been transmitted into the server from the assembly station. This is especially simple since both files reside in the server and a direct access of the required data is possible without the network.

Figure 3:
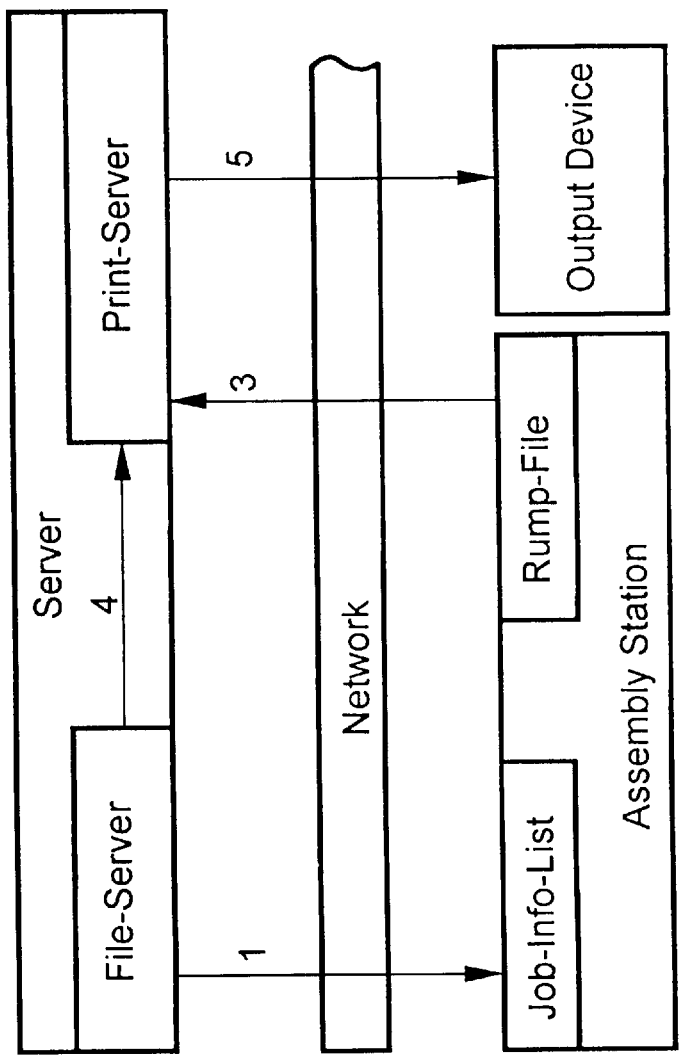
FIG. 3 is an illustration of the data flow of the invention.

In 5 steps, FIG. 3 shows how this is executed in detail. In step (1), the PostScript documents are transmitted from the server, i.e. from the file server, into the assembly station, which is also called work station. As already mentioned, the PostScript documents to be processed are usually multi-page, also always whenever work is being carried out with color, i.e. when chromatic images are processed, since a plurality of color separations are required for the reproduction of a color image. In order to be able to execute the process described above, the incoming PostScript documents—since individual pages are required for the imposition—are analyzed within the assembly station in a simple sorting process such the location of each and every page within the original file is identified and stored. Each page can be designationally called or addressed with this information. The storing of these data occurs in a list that is also called Job Info List. This list thus contains the references or addresses under which the individual pages can be found within the original document. Such a job info list is presented below for a simple PostScript document.

```
***********************************************************
** List of Detected PageElements
***********************************************************
 No.  Type             Index   Offset   Length   Page No.

0  HEADER            100          0   35325    0
  1  PROLOG            101     135632  435520    0
  2  DOCSETUP          102     571152   28963    0
  3  PAGEELEMENT       103     600115  600339    1
  4  INSERTIONPOINT      2     600339     100    1
  5  OTHERELEMENT        3     600439      71    1
  6  PAGEELEMENT       103     600510   31934    1
  7  PAGEELEMENT       103      63244     224    2
  8  INSERTIONPOINT      2     632668      60    2
  9  OTHERELEMENT        3     632728      92    2
 10  PAGEELEMENT       103     632820   31938
 11  PAGEELEMENT       103     664758     224    3
 12  INSERTIONPOINT      2     664982     300    3
 13  OTHERELEMENT        3     665282      95    3
 14  PAGEELEMENT       103     665377      95    3
 15  OTHERELEMENT        3     665472      93    3
 16  PAGEELEMENT       103     665565     169    3
 17  PAGEELEMENT       103     665734     224    4
 18  INSERTIONPOINT      2     665958     247    4
 19  OTHERELEMENT        3     666205      92    4
 20  PAGEELEMENT       103     666297      61    4
 21  OTHERELEMENT        3     666358      92    4
 22  PAGEELEMENT       103     666450     226    4
```

BoundingBox(1 b r t): 0.000000 0.000000 595.000000 792.000000

On the basis of this Job Info List, it is now possible to designationally address specific pages in the PostScript document and insert them into the output job. In step (2), a rump file is generated within the assembly station with the assistance of this Job Info List, this rump file being transmitted into the print server region of the server in step (3). As already mentioned, only these references about the location of the pages within the original PostScript file have been accepted into this rump file, so that it is possible to construct the entire PostScript form in the print server on the basis of this rump file.

The following list shows an example of such a rump file. All lines that begin with the character sequence "%%LMIn-clude:" contain a file name, an offset and a length with the assistance of which the complete print job can be produced according to the invention.

```
%!PS-Adobe-2.0
%%Title: x
%%Creator: LinoMontage
%%CreationDate:Mon Aug 22 14:51:30 1994
%%For: pierre
%%Pages: 1 1
%%BoundingBox: 0.000000 0.000000 842.000000 595.000000
%%PrintMode: PROOF
%%Orientation: Landscape
%%EndComments
userdict/LinoMontageSaveDict 3 dict def
LinoMontageSaveDict begin
/LM__sigsavefHLinoMontageSaveDict/LM__SIGSAVE save put) def
/LM__sigrestore ( clearHLinoMontageSaveDict/LM__SIGSAVE get
restore )def end
//LinoMontageSaveDict/LM__sigsave get exec
%%BeginProlog
. .
. .
%%EndProlog
%%BeginDocumentSetup
//LinoMontageDict/LM__Reset get exec
%+ Document Supplied Fonts
%%LM__EndDocumentSetup
%%__LM__Page: 1 1
%%Information for potentielle Farbmarke
//LinoMontageDict /LM__ColorCount 1 put
%BeginApplication: 1
%%ApplicationDocument:
/Net/nxserv/PostScriptPooI/Code/QuarkMac/Quark3.3__Mac/X
P3.3__LW8.ps
//LinoMontageDict/LM__SaveApplication get exec
//LinoMontageDict/LM__Reset get exec
%%BeginApplicationProlog:
%+ Reencode Fonts
%%EndApplicationProlog:
%%BeginElement: 1
(1)
//LinoMontageDict/LM__SaveElement get exec
%%BeginElementSetup
//LinoMontageDict/LM__Reset get exec
//LinoMontageDict/LM__RestoreState get exec
44.994377     44.994377 639.994385 836.994385
44.994377     44.994377 639.994385 836.994385
0.000000 1.000000 1.000000
//LinoMontageDict/LM__SetElementSystem get exec
%%EndElementSetup
%+Application DocumentSetup
%%LMInclude:
/Net/nxserv/PostscriptPool/Code/QuarkMac/Quark3.3__Mac/X
P3.3__LW8.ps
571152 28963
%+ Application Page
%%LMInclude:
/Net/nxserv/PostScriptPool/Code/QuarkMac/Quark3.3__M
ac/XP3.3__LW8.ps 600115 224
%%LMInclude:
/Net/nxserv/PostScriptPool/Code/QuarkMac/Quark3.3__M
ac/XP3.3__LW8.ps
600439 71
%%LMInclude:
/Net/nxserv/PostScriptPool/Code/QuarkMac/Quark3.3 Mac/
XP3.3__LW8.ps
632728 92
%%LMinclude:
/Net/nxserv/PostscriptPool/Code/QuarkMac/Quark3.3 Mac/
XP3.3__LW8.ps
665282 95
%%LMInclude:
/Net/nxserv/PostScriptPool/Code/QuarkMac/Quark3.3__Mac/
XP3.3__LW8.ps
665472 93
%%LMInclude:
/Net/nxserv/PostScriptPool/Code/QuarkMac/Quark3.3__Mac/
XP3.3__LWB.ps
666205 92
```

-continued

```
%%LMInclude:
/Net/nxserv/PostScriptPool/Code/QuarkMac/Quark3.3_Mac/
XP3.3_LW8.ps
666358 92
%%LMInclude:
/Net/nxserv/PostScriptPool/Code/QuarkMac/Quark3.3_Mac/
XP3.3_LW8.ps
600339 100
%%LMDeleted
%%LMInclude:
/Net/nxserv/PostScriptPool/Code/QuarkMac/Quark3.3_Mac/
XP3.3_LW8.ps
600510 31934
%+ Application Trailer
//LinoMontageDict/LM_ClearState get exec
//LinoMontageDict/LM_RestoreElement get exec
%%EndElement: 1
//LinoMontageDict/LM_RestoreApplication get exec
%%ApplicationDocument:
/Net/nxserv/PostScriptPool/Code/QuarkMac/Quark3.3_Mac/
XP3.3_LW8.ps
%%EndApplication: 1
%+ Marks for Element : 1
%%Trailer
//LinoMontageDict/LM_old_showpage get exec
%%Ende Ausgabe der Signatur
//LinoMontageDict/LM_Endsignature get exec
//LinoMontageSaveDict/LM_sigrestore get exec
%%Title: x
%%Creator; SignaStation
%%CreationDate:Mon Aug 22 14:51:30 1994
%%For: pierre
%%BeginTrailerLOC
%%EndTrailerLOC
```

The method of the invention is also referenced "Remote Page Including" (RPI), whereby "Remote Page Including" means that the PostScript data are not inserted into the document to be output to the exposer in the assembly station, but on the server.

A great advantage of this method is that the data need be copied only once via the network, as a result whereof network and time behavior are positively influenced and network capacity becomes free for other processes.

Although various minor changes and modifications might be proposed by those skilled in the art, it will be understood that our wish is to include within the claims of the patent warranted hereon all such changes and modifications as reasonably come within our contribution to the art.

We claim as out invention:

1. A method for electronic assembly of a printing form with a work station designed as an assembly station, the assembly station being connected to a server via a network, comprising the steps of:

successively storing individual PostScript pages as a PostScript job in one or more print-to-disk files on the server;

loading the one or more print-to-disk files into the assembly station via the network, the assembly station storing which pages are present and which positions the individual pages have within the corresponding one or more print-to-disk files;

in the assembly station, creating a first PostScript data file which contains include instructions but does not contain contents of the individual pages of the print-to-disk data files, said include instructions indicating where the individual pages are to be arranged on the printing form to be created and where the individual pages are located within the one or more print-to-disk files;

transferring the first PostScript data file to the server via the network;

in the server, creating a second PostScript data file from the first PostScript data file by use of the include instructions wherein contents of the pages of the printing form to be created are called up from the one or more print-to-disk files located on the server and inserting the contents of the pages into the first PostScript data file at the place where they are to be arranged on the printing form; and transferring the second PostScript data file from the server to an output station for the output of the printing form.

2. The method according to claim 1 including the steps of providing the server as a file server and a print server, the file server storing the individual PostScript pages as the PostScript job in said one or more print-to-disk files, and said print server creating the second PostScript data file and outputting it to the output station.

* * * * *